United States Patent
Morini et al.

(10) Patent No.: US 7,548,127 B2
(45) Date of Patent: Jun. 16, 2009

(54) DIGITALLY CONTROLLED RING OSCILLATOR

(75) Inventors: Sergio Morini, Pavia (IT); Raffaele Cannizzaro, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 107 days.

(21) Appl. No.: 11/697,878

(22) Filed: Apr. 9, 2007

(65) Prior Publication Data

US 2007/0247240 A1    Oct. 25, 2007

Related U.S. Application Data

(60) Provisional application No. 60/791,131, filed on Apr. 11, 2006.

(51) Int. Cl.
H03B 5/10 (2006.01)
(52) U.S. Cl. .................... 331/57; 331/177 R
(58) Field of Classification Search ............. 331/57, 331/177 R; 327/261, 263, 276, 277, 284
See application file for complete search history.

(56) References Cited

U.S. PATENT DOCUMENTS

| | | | |
|---|---|---|---|
| 7,265,638 B2 * | 9/2007 | Osvaldella | 331/57 |
| 2002/0171496 A1 | 11/2002 | Jordan et al. | |
| 2004/0070459 A1 | 4/2004 | Motoyama | |
| 2004/0263266 A1 | 12/2004 | Rosenbaum | |

OTHER PUBLICATIONS

A Scalable DCO Design for Portable ADPLL Designs, Chia-Tsun Wu et al, pp. 5449-5452, Aug. 2005.
DIGICC™ PLL Technology, Technology Background, C³IP, Nov. 2004.

* cited by examiner

*Primary Examiner*—Rexford Barnie
*Assistant Examiner*—Thienvu V Tran
(74) *Attorney, Agent, or Firm*—Ostrolenk, Faber, Gerb & Soffen, LLP

(57) ABSTRACT

A ring oscillator for generating an output signal, comprising a plurality of serially connected main elements for selectively delaying a signal input thereto, each of the plurality of main elements having two circuit paths, a first path including at least one time-delay element for delaying a signal input thereto and a second circuit path bypassing the first circuit path; and a multiplexor (MUX) having a first input coupled to the first circuit path including the at least one time-delay element and a second input coupled to the second circuit path, the MUX selecting the first or second inputs of a plurality of inputs and outputting an output signal.

18 Claims, 3 Drawing Sheets

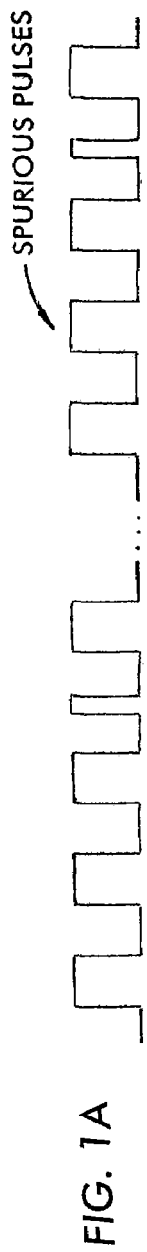
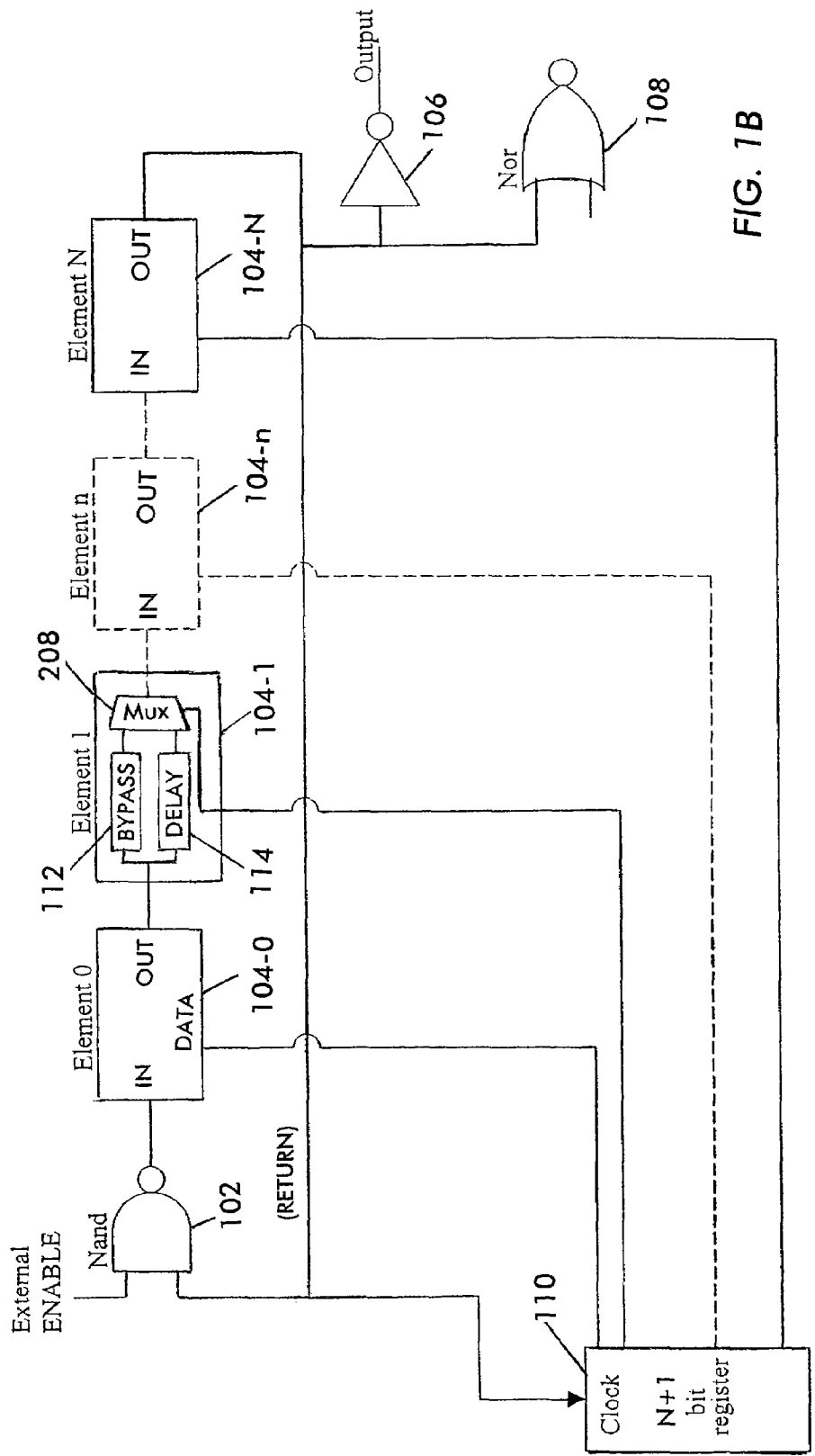
FIG. 1A
FIG. 1B

DIGITALLY CONTROLLED RING OSCILLATOR

CROSS-REFERENCE TO RELATED APPLICATION

This application is based on and claims priority to U.S. Provisional Patent Application Ser. No. 60/791,131, filed on Apr. 11, 2006 and entitled DIGITALLY CONTROLLED RING OSCILLATOR, the entire contents of which are incorporated by reference herein.

SUMMARY OF THE INVENTION

The present invention relates to a digitally-controlled ring oscillator and, more particularly, to a digitally-controlled ring oscillator having an adjustable period and a method for operating the same.

BACKGROUND OF THE INVENTION

Phase locked loop (PLL) is a fundamental building block of modern digital and mixed signal integrated circuits (ICs), PLL circuits are used for, among other things, clock generation, multiplication, and signal recovery. Since mixed-signal ICs are typically noisy environments, there has been a trend to reduce analog parts of signal processing and to use digital circuits whenever possible, as digital circuits are more resistant to noise, easy to migrate between technologies, and are easy to test and configure. Typically, only analog-to-digital converters and PLL circuits include analog circuitry. However, a new type of PLL, called All-Digital PLL (ADPLL), has gained popularity. In ADPLL circuits, analog circuitry is minimized, and all signals in an ADPLL main loop are digital. However, a digitally-controlled oscillator (DCO) using a digital word to control the frequency, the counterpart of a voltage-controlled oscillator (VCO), typically comprises an analog circuit.

Accordingly, it is an object of the present invention to provide a digital DCO. Moreover, the present invention discloses a DCO that uses standard digital cells, and is suitable for automatic digital layout tools without any extra specifically-designed circuits. Accordingly, circuits designed according to the present invention, are easy to migrate from one integration technology to another.

Conventional oscillators include analog and digital types which are well-known and are used for many electronic devices. For example, mobile communication devices, such as cellular phones, personal digital assistants (PDAs), and other electronic communication devices, use oscillators to mix signals for transmission and/or reception. Unfortunately, conventional oscillators, such as voltage-controlled oscillators (VCOs), typically rely upon quartz crystals to produce an output signal. Further, these oscillators require the use of analog circuits that requires more space than a digital circuit and are difficult to integrate with a digital circuit (i.e., to form a mixed-use circuit). Therefore, with chip-space at a premium, analog circuits are not desirable. Additionally, quartz crystals consume power and are sensitive to variations in temperature, which can affect the accuracy of an output signal. Moreover mixed-use circuits are difficult to design and manufacture, which can increase cost and design time.

Accordingly, it is desirable to provide a digitally-controlled oscillator (DCO) for use with various digital circuits and devices.

SUMMARY OF THE INVENTION

The present invention relates to a digitally-controlled ring oscillator and, more particularly, to a digitally-controlled ring oscillator having an adjustable period and a method for operating the same.

In accordance with the present invention, a digitally-controlled oscillator (DCO) having an adjustable period and low jitter is disclosed. Additionally, the circuit according to the present invention reduces board circuitry, which can have a desirable effect on noise characteristics of a digital circuit. Accordingly, it is an aspect of the present invention to provide a method for fabricating a ring oscillator using standard digital library blocks which may be used with one or more chip manufacturing technologies. Moreover, it is an aspect of the present invention to provide a ring oscillator that is digitally selectable "on-the-fly." It is a further aspect of the present invention to provide a digital ring oscillator that is suitable for automatic layout tools, is impervious to noise and digital interference, requires a small footprint, and has a wide tuning range.

In accordance with an object of the present invention, there is disclosed a ring oscillator for generating an output signal, the ring oscillator comprising a plurality of serially connected main time-delay elements, for delaying a signal input thereto, each of the plurality of main time-delay elements having two circuit paths, a first path including at least one time-delay element for delaying a signal input thereto, and a second circuit path bypassing the first circuit path, a multiplexor (MUX) having a first input coupled to the first circuit path including the at least one time-delay element and a second input coupled to the second circuit path, the multiplexor selecting the first or second circuit paths and outputting an output signal.

In accordance with a further object of the invention, it is also preferable to include a flip flop for latching and outputting a received signal upon receiving a clock signal, the flip flop having clock and data inputs and an output coupled to a data select line of the MUX. The ring oscillator may further include an N+1-bit register for controlling a mode of one or more of the main time-delay elements. The ring oscillator may also include circuitry for trimming the period of the ring oscillator, the circuitry for trimming the period of the ring oscillator being coupled to the at least one time-delay element. A controller may be preferably included for controlling the overall operation of the ring oscillator. For example, the controller may determine a desired period and may determine a preferred mode for one or more of the ring oscillators.

In accordance with yet another object of the present invention, there is disclosed a method for controlling a ring oscillator for generating an output signal, the ring oscillator having a plurality of serially disposed main elements each having a MUX, the method including the steps of generating an input signal, transmitting the input signal to at least one of the plurality of serially disposed main elements, receiving the input signal and transmitting the input signal on parallel paths having different delays, selecting, using a corresponding MUX, a desired path of the parallel paths corresponding to a mode of the corresponding element, and outputting an output signal corresponding to the input signal.

In accordance with yet a further object of the present invention, the method may include transmitting the output signal to an input of another main element of the plurality of main elements and selectively controlling the mode of the another main element. In accordance with further objects of the present invention, the method may further include transmitting, by the MUX, the signal received from the desired path, wherein at least one of the paths has a time delay element. It is also envisioned that the method may include latching, using a flip flop, a received signal and outputting, to the MUX, the received signal for selecting a bypass or connected mode upon receiving a clock signal. It is also envisioned that the method may include controlling, using an N+1-bit register, a mode of one or more of the main elements. The method may further include trimming the period of the ring oscillator and/or controlling, using a controller connected to the N+1-bit register, the mode of a corresponding main element of the serially disposed main elements, the mode corresponding to a bypassed or a connected state.

In accordance with yet further objects of the present invention, there is disclosed a ring oscillator for generating an output signal, the ring oscillator may include a plurality of main elements for selectively delaying a signal input thereto, each of the plurality of main elements having a first transmission path having at least one time-delay element for delaying a signal input thereto, a second transmission path having substantially no delay, and a multiplexor (MUX) having a first input coupled to the first transmission path, a second input coupled to the second transmission path, and a select input for selecting a first or a second transmission path and outputting a corresponding signal.

In accordance with yet another object of the present invention, the first transmission path may include at least an inverter chain having an even number of inverters connected in series with each other. The ring oscillator may further include N+1 main elements, each including a delay element, wherein the number of inverters in each delay element is determined by $2^{n+1}-2$, where n is the number of a corresponding main element of the N main elements. It is also envisioned that one or more of the main elements may include a flip flop having clock and data inputs and an output coupled to a data select line of the MUX, the flip flop outputting and latching a signal received on the data input upon receiving a clock signal, the clock signal being based on the signal input into the corresponding main element and a signal output by the first transmission path.

BRIEF DESCRIPTION OF THE DRAWING(S)

The above and other objects, features and advantages of the present invention will become more apparent from the following detailed description when taken in conjunction with the accompanying drawings, in which:

FIG. 1A is an illustration of an output signal having a spurious pulse;

FIG. 1B is a schematic illustration of a ring oscillator according to the present invention;

DETAILED DESCRIPTION OF EMBODIMENTS OF THE INVENTION

Figure 2:
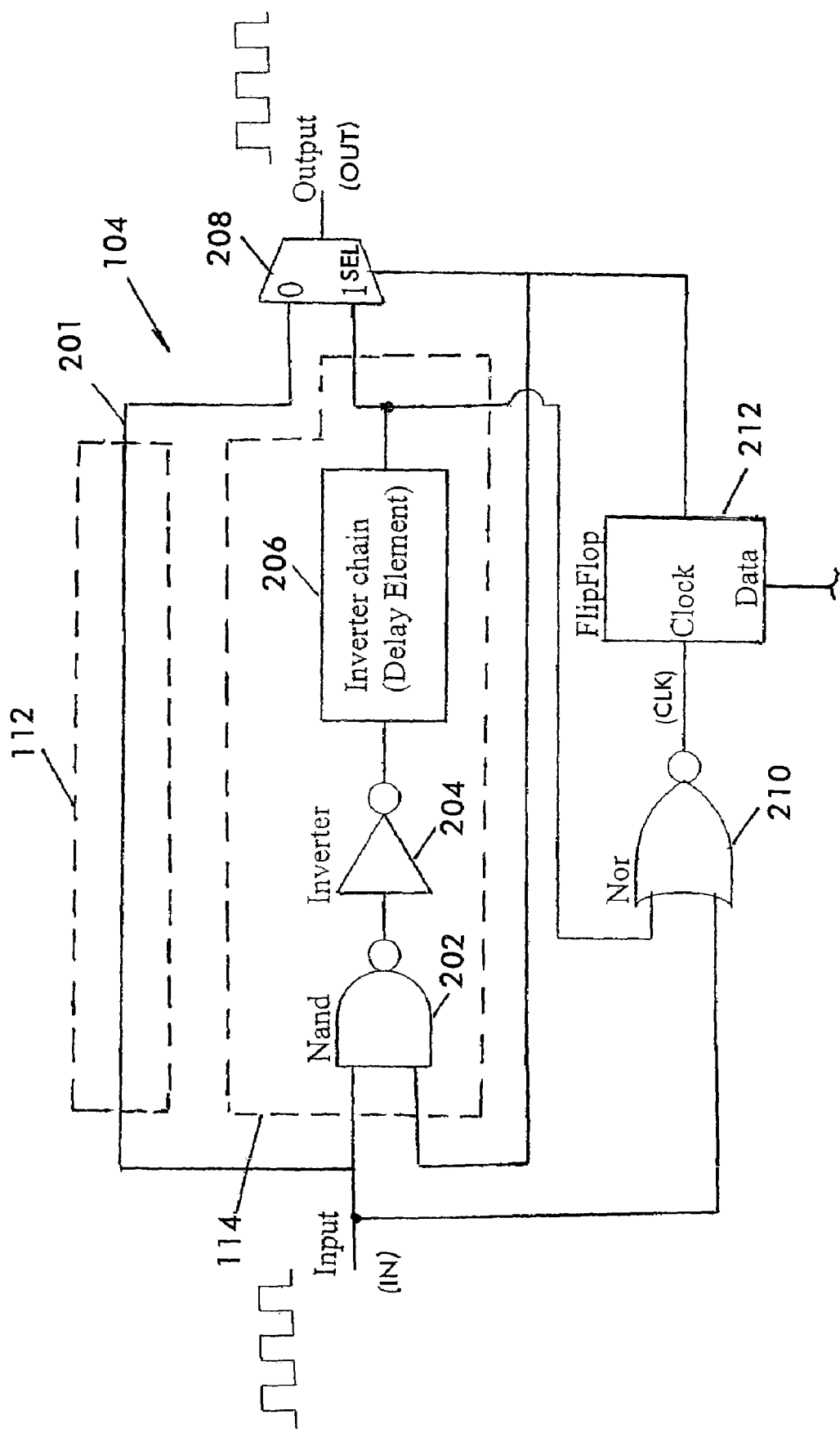
FIG. 2 is a detailed schematic view illustration of a single main time-delay element shown in FIG. 1.

The following detailed description of the preferred embodiments of the present invention will be made with reference to the accompanying drawings. In describing the invention, explanations about related functions or constructions which are known in the art will be omitted for the sake of clarity in understanding the concept of the invention.

For the sake of clarity, in each of the following figures, only block diagrams will be shown in many of the figures.

A schematic illustration of a ring oscillator according to the present invention is shown in FIG. 1B. The ring oscillator 100 includes a NAND gate 102, a plurality of main elements 104 (e.g., 104-0-104-N), an output gate 106, a capacitive load equalization gate 108, and an N+1-bit register 110 (or other switching means).

An aim of the invention is to allow "on the fly" changing of an amount of delay, and thus the output frequency of the oscillator. According to the invention, this is performed by switching in or out main time delay elements 104. However, in the absence of circuitry employed in the main elements 104 according to the invention, if an element 104 is asynchronously switched in or out of the oscillator loop, it is possible, for example, that spurious pulses will be generated as shown, for example, in FIG. 1A. This could happen, e.g., if an element is switched off when a pulse is being transmitted through it. These spurious pulses will then be propagated through the oscillator loop ad infinitum until the circulation is terminated. According to the present invention, the oscillator frequency can be changed "on the fly" without the generation of said spurious pulses.

With reference to FIG. 1B, as shown, the NAND gate 102 includes inputs for receiving an enable signal (ENABLE) which is generated by, for example, a controller (not shown) and a feedback (RETURN). The ENABLE signal in the embodiment shown is a logic high level. The NAND gate 102 produces a change of state signal (PULSE) in accordance with the received and the RETURN signals. Although the NAND gate 102 is shown, in other embodiments, it is envisioned that other gates or combinations thereof may be used. For example, in some embodiments an AND gate and an inverter (both of which are not shown) may be substituted for the NAND gate 102. Alternatively, it is also envisioned that a controller (not shown) may be used. In the embodiment shown, each main element 104 has an even number of inverters, so that the total number of inverters is (including the NAND gate 102) odd, and the total number of inversions within the ring oscillator 100 is odd.

Each main element 104 includes an input terminal (IN) for receiving an input signal, an output terminal (OUT) for outputting an output signal, and a data terminal (DATA) for selecting a mode of a corresponding main element 104. For example, the data terminal (DATA) may be used to select a connected mode, in which an input signal is delayed via a delay path, or a bypassed mode, in which input signals are transmitted via a bypass path 112 and, thus, bypass the delay circuitry 114. Accordingly, the delay mode and the bypass mode control the delay of a signal that is received on the input terminal and output via the output terminals. Although not shown in FIG. 1B, a detailed description of the main elements 104 will be given below with reference to FIG. 2.

Returning to FIG. 1B, the plurality of main elements 104 are serially coupled to each other such that an output of a preceding main element (e.g., 104-0) is coupled to an input of a subsequent main element (e.g., 104-1). The input terminal of a first main element 104-0 of the main elements 104 is positioned so as to receive the PULSE signal, and the output of the last main element 104 (i.e., 104-N) generates the RETURN signal after a delay determined by the number of main elements 104, which is in accordance with the PULSE signal, as its output.

The delayed output change of state signal from element 104-N is provided back to the other input of NAND gate 102.

When this change of state signal is received at the other input of NAND gate 102 after the delay (a negative going signal in the embodiment shown), the NAND gate output goes high, thus generating the PULSE signal. This low to high transition is then propagated through the oscillator elements 104-0 to 104-N and the cycle continues. When the low to high state is output from element 104-N (after the delay), the NAND gate 102 output again goes low (ENABLE remains high) and the gate continues indefinitely until the enable signal is removed. The frequency of oscillation is determined by the number of main elements 104.

The N+1-bit register 110 receives the return signal as a clock input. The N+1-bit register 110 generates N+1 output signals, one for each main element 104. Each of the N+1 outputs comprises a corresponding signal which is used for controlling the mode of each of the N+1 main elements 104 (i.e., 104-0 to 104-N). The N+1-bit register is used to select the elements that are in the oscillator delay circuit. If an element 104 is selected, the DATA input is high. If the element 104 is being bypassed, then the DATA input to that element is low. In the preferred embodiment, the N+1-bit register and/or the ENABLE signal are controlled by a controller which, for the sake of clarity, is not shown. As shown, each of the N+1 outputs (i.e., outputs 0-N) of the N+1-bit register 110, is coupled to a data input (DATA) of a corresponding main element 104 (0-N) so that the mode of the corresponding main element 104 can be controlled. However, it is also envisioned that a register having another number of outputs may be used. Accordingly, only main elements 104 connected to these outputs would be controlled by the register. Moreover, other means of transmitting data signals to selected main elements may be used.

The output inverter 106 is coupled to the output of the $N^{th}$ main element 104-N so that the output inverter 106 inputs the RETURN signal, inverts the RETURN signal, and thereafter outputs a corresponding signal as an output (OUT) of the ring oscillator 100.

As shown in FIG. 1, a NOR gate 108 may be provided to allow for capacitive load equalization for equalizing the capacitance of the output terminals associated with the RETURN signal.

A detailed schematic view illustration of a single main element 104 shown in FIG. 1 is shown in FIG. 2. In the embodiment, main element 104 includes a NAND gate 202, an inverter 204, an inverter chain delay element 206, a multiplexor (MUX) 208, a NOR gate 210, and a flip flop 212.

The NAND gate 202 has two inputs, a first input which receives an input signal (IN) and a second input which receives an output of the flip flop 212. An output of the NAND gate 202 is connected to the inverter 204. The NAND gate functions to block oscillations through the delay element 206 when the main element 104 is in the bypass mode. As shown, the inverter 204 is used to keep the number of inverters within the main element 104 even in the embodiment described. The inverter 204 is connected to the inverter chain delay element 206. An output of the inverter chain delay element 206 is connected to the MUX 208. The number of delay elements in each of the inverter delay chain elements 206 is preferably equal to $2^{n+1}-2$ where n corresponds to the number (i.e., 0 to N) of the corresponding main element 104 (the bit of register 110).

The MUX 208 includes a data select input (SELECT), an output and two data input terminals, labeled 0 and 1, which are respectively connected to the input terminal (so as to receive the input signal (IN)) and to the output of the inverter chain delay element 206. When the MUX is in the "0" mode, the bypass circuit 201 is selected. When the MUX is in the "1" mode, the oscillator goes through the delay element 206.

The NOR gate receives two inputs, i.e., the output of the inverter chain delay element 206 and the input signal (IN).

The flip flop 212 receives the output of the NOR gate 210 as a clock signal (CLK) and receives a data signal (DATA), which is used to select the mode of the main element 104, from the N+1-bit register 110 (FIG. 1B). The flip flop 212 may be an edge triggered type and latches the input signal. As shown in the present example, the data signal (DATA) is set to 0 to select the bypassed mode and set to 1 to select the connected mode, i.e., when delay element 206 is to pass oscillations. However, other variations are also possible.

Again, with reference to FIG. 2, the operation of each single main element of the present invention will be described. Assuming the connected state, the DATA input (DATA) of flip flop 212 would be set to 1 and the output of the flip flop 212 would correspondingly be set to 1 when a clock signal edge is received at the input from NOR gate 210. This will occur when either of the inputs to the NOR gate transitions (which will be the case when the delay element 206 is selected). Accordingly, the NAND gate 202 would be enabled when it receives a logic 1, and the data select input (SELECT) of the MUX 208 would also be a logic 1, which would cause the MUX 208 to pass signals received from the inverter chain 206. As mentioned elsewhere in this application, in the connected state, input signal pulses are coupled through the NAND gate 202, the inverter 204, the inverter chain delay element 206, and the MUX 208, and are output as output signals (OUT). Conversely, signals received at the 0 input of the MUX 208 (i.e., bypassed signals), are not selected by the MUX 208.

To switch to the bypassed state from the connected state, the DATA input (DATA) to the flip flop 212 would first be set to a logic 0 by register 110. Accordingly, when the pulsed input signal (IN) goes to a logic 0, it would be coupled through NAND gate 202, the inverter 204, and the inverter chain delay element 206 into a first input of the NOR gate 210. Likewise the input signal (IN) would be coupled to the other input of the NOR gate 210. Accordingly, upon receiving two logic 0's, the NOR gate would output a logic 1 into the clock input of the flip flop 212 which would cause the flip flop 212 to latch and output the logic 0 that was received on the DATA input (DATA) to the data select input (SELECT) of the MUX 208. Thereafter, the MUX 208 would pass signals received on data input terminal 0, which is connected to the input terminal (IN) via the bypass circuit 201. Conversely, the MUX 208, will then block signals received from data input terminal 1, which are received from the inverter chain delay element 206.

The NOR gate 210 enables the change of the flip flop 212 output state only when the input to the MUX 208 is "0," thus preventing switching when a high level is present, eliminating the possibility of spurious truncated pulses, as discussed above with respect to FIG. 1A. Accordingly, when DATA to flip flop 212 is high, the element 104 is selected and the delay element 106 is connected to the overall ring oscillator, adding in its preset delay.

To switch back to the connected state (element 206 in circuit) from the bypassed state, a logic 1 would be input to the DATA input (DATA) of the flip flop 212. Accordingly, when the input signal (IN) pulses go to a logic 0, they are coupled to the NOR gate 210. Also, as the NAND gate 202 is disabled in the bypassed mode, the NAND gate 210 output is at a logic 1 which would then be inverted by the inverter 204 and subsequently be output as a logic 0 by the inverter chain 0 delay element 206 (which does not invert as it has an even number of elements). Accordingly, when both inputs of the NOR gate 210 go to a logic 0, the NOR gate output will change to a logic 1 which would cause the flip flop to latch and output the logic 1 that was received on the DATA input (DATA). Accordingly, the data select input (SELECT) of the MUX 208 would receive a logic 1 which would cause the MUX 208 to pass signals received on data input terminal 1, which is connected to the inverter chain 206 delay element. Conversely, the MUX 208, will then block signals received from data input terminal 0, which are directly received (i.e., no delay) from the data (IN) terminal. Similarly to when the mode changes from "connected" mode to "bypass" mode, when going from "bypass" to "connected," the NOR gate 210 ensures that switching of MUX 208 only occurs when a "0" level is present at its input.

The NOR gate 210 enables the charge of the flip flop 212 output state only when the input to the MUX 208 is "0," thus preventing switching when a high level is present, eliminating the possibility of spurious truncated pulses, as discussed above with respect to FIG. 1A.

Figure 3:
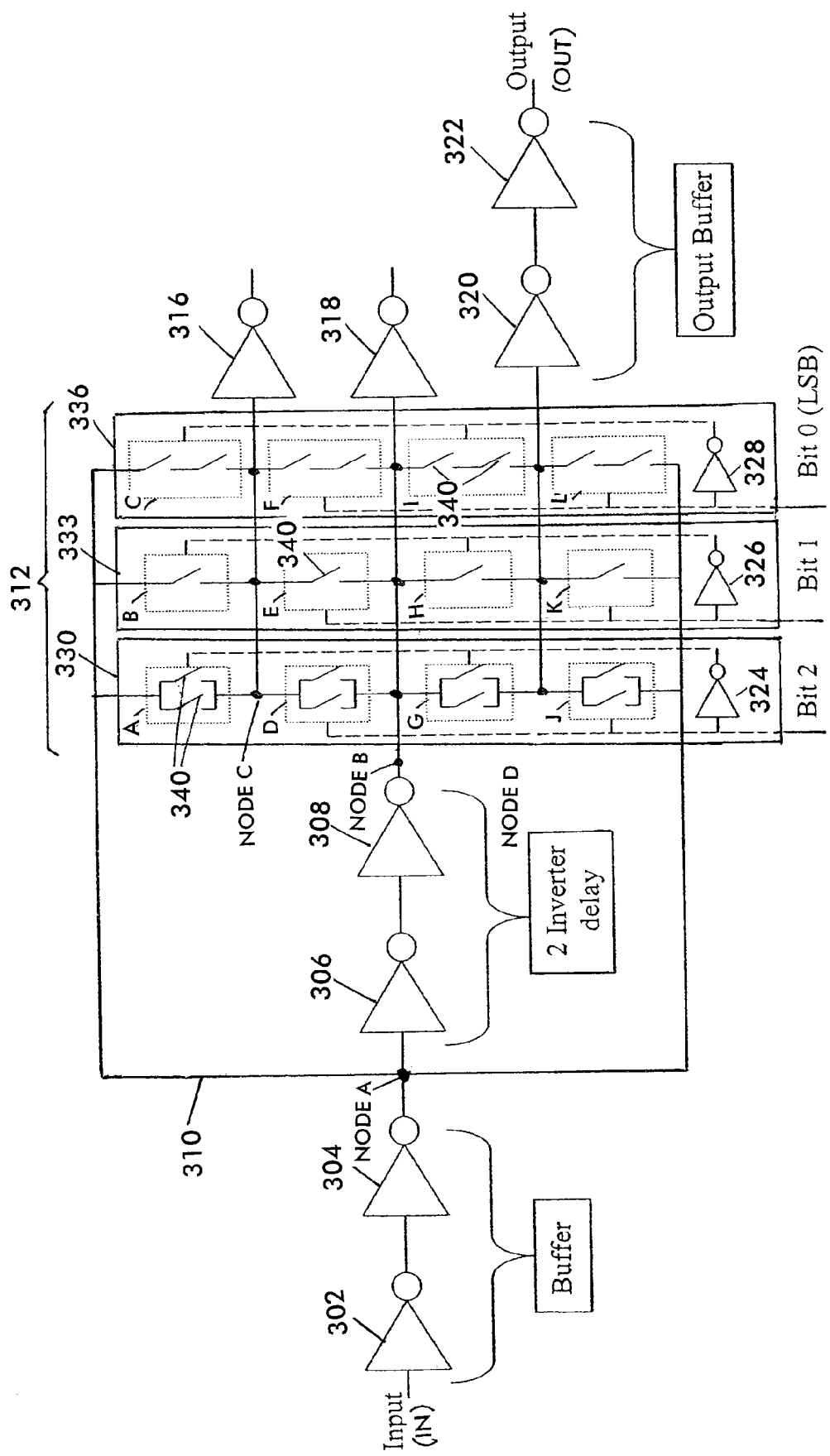
FIG. 3 is a schematic view illustration of a trimming element for trimming the period of the ring oscillator with a step smaller than two inverters, delay.

A benefit of the present invention, as shown in FIG. 2, is that each element has an equal load. For example, in the present embodiment, the NAND gate 202, the NOR gate 210 and the Inverter chain 206 each has an equal load, as will be explained below. Since the minimum delay that can be implemented by each main element 104 is that of two inverter stages (each element has an even number of inverters), it is necessary to be able to trim the delay for fractional amounts of delay less than the delay of two inverters. This may be necessary, for example, to implement a deemed frequency of operation that is not based on an even number of inverter delay periods. FIG. 3 shows how this is accomplished.

A schematic diagram of a trimming element for trimming the period of the ring oscillator with a step smaller than two inverters' delay is shown in FIG. 3. The trimming element 300 illustrates a three-bit (i.e., 8 step) example and has a minimum step period of a ¼ inverter delay. The trimming element 300 includes inverters 302, 304, 306, 308, 316, 318, 320, 322, 324, 326, and 328, and a switching array 312. The switching array 312 includes a plurality of switches 312A-312L arranged in a column and row format. The switches 312A, 312D, 312G, and 312J are arranged in a first column 330 have a resistivity of 0.5 units which, for example, can be is obtained by placing two switches 340 in parallel, as shown. The switches 312B, 312E, 312H, and 312K are arranged in a second column 333 have a resistivity of 1 unit, which, for example, is obtained by using a single switch 340, as shown. Finally, the switches 312C, 312F, 312I, and 312L are arranged in a third column 336 and have a resistivity of 2 units which, for example, can be obtained by placing two switches 340 in series with each other, as shown.

Buffers 302 and 304 act as buffers for buffering an input signal (IN) and outputting the buffered input signal (IN) into a node A. Inverters 306 and 308 are serially coupled to each other with the input of inverter 306 being coupled to node A and an output of inverter 308 coupled to node B.

Switches 312A, 312B, and 312C, are arranged in parallel in the uppermost row and are coupled to the node A on a first side and are coupled node C on a second side thereof. Switches 312D, 312E, and 312F are arranged in parallel in the second row and are coupled to node C on a first side and are coupled to node B on a second side thereof. Switches 312J, 312K, and 312L are arranged in parallel in the lowermost row and are coupled to node A on a first side and are coupled to node D on a second side thereof. Switches 312G, 312H, and 312I are arranged in parallel in the third row from the top and are coupled to node D on a first side and are coupled to node B on a second side thereof.

Each of the switches in the switching array 312 is controlled by a control signal which, for example, includes one or more control lines. As the present example is a three bit example, the control lines include Bits 0-2 which comprise least most significant bit (LSB) to most significant bit (MSB), respectively and control corresponding switches in the first to third columns of the array, respectively. Bit 2 controls the switching of switches 312D and 312J and the inverse of Bit 3 controls the switching of switches 312A and 312G. Bit 1, controls the switching of switches 312F and 312L, and the inverse of Bit 1 controls the switching of switches 312B and 312H. Bit 0 controls the switching of switches 312C and 312I, and the inverse of Bit 0 controls the switching of switches 312C and 312I.

Inverters 316 and 318 are used for capacitive load equalization and have unused outputs, as shown, and are therefore dummy switches. The inverter 316 has an input which is coupled to node C, and inverter 318 has an input which is coupled to node B. The inverter 320 has an input coupled to node D and an output coupled to an input of the inverter 322. The inverter 322 provides an output signal (OUT), as shown.

Inverters 320 and 322 act as an output buffer for the output signal (OUT).

The trimming circuit operates as follows: In order to obtain the minimum ¼ inverter delay, all bits (bit 2, bit 1, and bit 0) are turned on. This turns on switches 340J, 340K, and 340L, placing all in parallel, resulting in the least delay. At the same time, switches 340D, 340E and 340F are also turned on, for the capacitive equalization.

The output is provided at the output buffer 322 output trimmed to ¼ inverter delay.

The next step (½ inverter delay) would be obtained when bits 2 and 1 are on and bit 0 is off.

Similarly, by appropriate selection of bits 0, 1, and 2, 8 steps of delay in ¼ inverter delay increments can be obtained (up to two inverter delays).

Also note that the trimming element is balanced. Node A has an inverter and 6 switches as its level (inverter 306 and switches 340A, 340B, 340C, 340J, 340K, and 340L). Node B has one inverter and six switches as its load (inverters 318 and switches 340D, 340C, 340F, 340G, 340H, and 340I).

The trimming element may be included in each main element 104 or a single trimming element may be coupled in series anywhere in the ring oscillator.

Although the present invention has been described in relation to particular embodiments thereof, many other variations and modifications and other uses will become apparent to those skilled in the art. It is preferred, therefore, that the present invention not be limited by the specific disclosure herein.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A ring oscillator for generating an output signal, comprising:
 a plurality of serially connected main elements for selectively delaying a signal input thereto, each of the plurality of main elements having:
 two circuit paths, a first path including at least one time-delay element for delaying the signal input thereto to produce a delayed signal input;
 a second circuit path bypassing the first circuit path;

a multiplexor (MUX) having a first input coupled to the first circuit path including the at least one time-delay element and a second input coupled to the second circuit path, the MUX selecting the first or second inputs and outputting an output signal; and a selector circuit for selecting the first or second input of the multiplexor, said selector circuit latching and outputting a received data signal upon receiving a clock signal, and wherein the clock signal is generated by a logic circuit receiving said signal input and said delayed signal input, whereby the clock signal is only generated to latch said received data signal when both said signal input and said delayed signal input will not cause said multiplexor to select one of said first and second inputs when a pulse is present on one of said first and second inputs.

2. The ring oscillator of claim 1, wherein the selector circuit comprises a flip flop for latching and outputting the received data signal upon receiving the clock signal, the flip flop having clock and data inputs and an output coupled to a data select line of the MUX.

3. The ring oscillator of claim 2, further comprising a controller for controlling whether the first or second circuit paths of each of the main elements is selected.

4. The ring oscillator of claim 3, further comprising circuitry for trimming the period of the ring oscillator, the circuitry for trimming the period of the ring oscillator being coupled to the at least one time-delay element.

5. The ring oscillator of claim 3, wherein the controller comprises a register having outputs coupled to an input of each main element for selecting whether the first or second circuit path is selected.

6. The ring oscillator of claim 1, wherein the selector circuit coupled to the multiplexor insures that the MUX selects an input when a pulse is not present at the selected input thereby to prevent truncating a pulse.

7. The ring oscillator of claim 6, wherein the selector circuit clocks a mode selection signal to the MUX only when a pulse is not present at the MUX input being selected.

8. A method for controlling a ring oscillator for generating an output signal, the ring oscillator comprising a plurality of serially disposed main elements each comprising first and second circuit paths, a multiplexor (MUX) having first and second inputs connected respectively to the first and second circuit paths, and a selector circuit, the method comprising the steps of:

providing an input signal on the first and second circuit paths of the main element;

generating a delayed signal on the first path; and selecting, using the MUX, a desired path of the first and second circuit paths corresponding to a selected mode of the main element, and the step of selecting comprising selecting, using the selector circuit, the first or second input of the multiplexor, said selector circuit latching and outputting a received data signal upon receiving a clock signal, and wherein the clock signal is generated by a logic circuit receiving said input signal and said delayed signal, whereby the clock signal is only generated to latch said received data signal when both said input signal and said delayed signal will not cause said multiplexor to select one of said first and second inputs when a pulse is present on one of said first and second inputs.

9. The method of claim 8, further comprising transmitting the output signal to an input of another main element of the plurality of main elements and selectively controlling the mode of the another main element.

10. The method of claim 8, further comprising transmitting, by the MUX, the signal received from the desired path, wherein at least one of the paths has a time delay element.

11. The method of claim 8, further comprising latching, using a flip flop as the selector circuit, the received data signal as a mode selection signal and outputting, to the MUX, the received data signal for selecting a bypass or connected mode upon receiving a clock signal.

12. The method of claim 8, further comprising controlling, using a register, a mode of one or more of the main elements.

13. The method of claim 8, wherein the main element has a minimum delay time determined by the delay time of an inverter element, and further comprising trimming the period of the ring oscillator in a time increment that is a fraction of the delay time of the inverter element.

14. The method of claim 12, further comprising controlling, using a controller connected to the register, the mode of a corresponding main element of the serially disposed main elements, the mode corresponding to a bypassed or a connected state.

15. A ring oscillator for generating an output signal, comprising:

a plurality of main elements for selectively delaying a signal input thereto, each of the plurality of main elements having:

a first transmission path having at least one time-delay element for delaying the signal input thereto to produce a delayed signal input;

a second transmission path having substantially no delay;

a multiplexor (MUX) having a first input coupled to the first transmission path, a second input coupled to the second transmission path, and a select input for selecting the first or a second transmission path and outputting a corresponding signal; and a selector circuit for selecting the first or second input of the multiplexor, said selector circuit latching and outputting a received data signal upon receiving a clock signal, and wherein the clock signal is generated by a logic circuit receiving said signal input and said delayed signal input, whereby the clock signal is only generated to latch said received data signal when both said signal input and said delayed signal input will not cause said multiplexor to select one of said first and second inputs when a pulse is present on one of said first and second inputs.

16. The ring oscillator of claim 15, wherein the first transmission path comprises at least an inverter chain having an even number of inverters connected in series with each other.

17. The ring oscillator of claim 15, further comprising N main elements, wherein the number of inverters in each element is determined by $2^{n+1} - 2$, where n is the number of a corresponding main element of the N main elements.

18. The ring oscillator of claim 15, wherein the selector circuit comprises a flip flop having clock and data inputs and an output coupled to a data select line of the MUX, the flip flop outputting and latching the received data signal received on the data input, upon receiving a clock signal, the clock signal being based on the signal input into the corresponding main element and a signal output by the first transmission path.

* * * * *